United States Patent
Rosenbaum et al.

(10) Patent No.: US 7,023,195 B2
(45) Date of Patent: Apr. 4, 2006

(54) MODULE, SYSTEM AND METHOD FOR TESTING A PHASE LOCKED LOOP

(75) Inventors: Yair Rosenbaum, Herzelia (IL); Sergey Sofer, Herzelia (IL); Emil Yehushua, Herzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 236 days.

(21) Appl. No.: 10/670,683

(22) Filed: Sep. 25, 2003

(65) Prior Publication Data

US 2004/0061488 A1   Apr. 1, 2004

(30) Foreign Application Priority Data

Oct. 1, 2002  (GB) .................................. 0222686

(51) Int. Cl.
G01R 23/12  (2006.01)
H03D 3/24  (2006.01)

(52) U.S. Cl. .................................. 324/76.53; 375/376

(58) Field of Classification Search ....... 324/76.52–53, 324/76.39, 76.11, 76.41–42, 76.77, 73.1, 324/622; 327/3, 20, 48, 141–161, 105; 375/224, 375/226, 371, 376, 215, 294, 327; 714/30, 714/733
See application file for complete search history.

(56) References Cited

U.S. PATENT DOCUMENTS

| | | | |
|---|---|---|---|
| 5,295,079 A * | 3/1994 | Wong et al. ................ 714/715 |
| 5,663,991 A | 9/1997 | Kelkar | |
| 5,729,151 A * | 3/1998 | Zoerner et al. ............. 324/765 |
| 6,185,510 B1 | 2/2001 | Inoue | |
| 6,522,122 B1 * | 2/2003 | Watanabe et al. ........ 324/76.77 |
| 6,642,701 B1 * | 11/2003 | Boateng .................. 324/76.53 |
| 6,661,266 B1 * | 12/2003 | Variyam et al. ............ 327/159 |
| 6,731,681 B1 * | 5/2004 | Delmas ...................... 375/227 |
| 6,812,759 B1 * | 11/2004 | Suzuki ....................... 327/158 |
| 6,859,028 B1 * | 2/2005 | Toner ...................... 324/76.53 |

FOREIGN PATENT DOCUMENTS

| EP | 0889411 A2 | 1/1999 |
|---|---|---|
| EP | 1148340 A2 | 10/2001 |
| FR | 2789181 A | 8/2000 |

* cited by examiner

Primary Examiner—Vincent Q. Nguyen
Assistant Examiner—Hoai-An D. Nguyen
(74) Attorney, Agent, or Firm—Susan C. Hill

(57) ABSTRACT

A digital test module (5) is provided for testing a phase locked loop circuit. The module (5) includes phase detection circuitry (10) for performing phase measurements of the phase locked loop circuit and analog test circuitry (20) for testing at least one analog element of the phase locked loop circuit. Frequency measurement circuitry (30) is provided for performing frequency measurements of the phase locked loop circuit, as is circuitry (40) for performing calibration and jitter measurements. In this way cycle-to-cycle and phase jitter measurements may be made. A calibration mechanism is provided allowing a process evaluation to be made and which allows the jitter data to be provided in a few seconds. The fully digital design facilitates easy manufacture and ready retargeting of the module to diverse applications and processes.

8 Claims, 3 Drawing Sheets

MODULE, SYSTEM AND METHOD FOR TESTING A PHASE LOCKED LOOP

FIELD OF THE INVENTION

This invention relates to the testing of phase locked loops, and particularly but not exclusively to such testing of phase locked loops in devices such as network communication systems, wireless subscriber units, wireless infrastructure and the like.

BACKGROUND OF THE INVENTION

Phase Locked Loops (PLLs), are used in a high proportion of current electronic devices, including mobile telephones and other communication equipment. In such devices there is an increasing move for reliability, cost and performance reasons to replace analogue components wherever possible with digital equivalent circuitry.

It is important that any phase 'jitter', (i.e. a spurious phase discrepancy) occurring in PLLs is identified and compensated for.

In the field of this invention it is known to perform only a frequency count of a PLL, and to perform a "pass/fail" test for only phase jitter, the output of the PLL not being calibrated internally.

However, this approach has the disadvantages that at least one analogue part is required. Furthermore, no cycle-to-cycle jitter measurement is performed, and there is no calibration mechanism that allows the determination of the jitter value.

A need therefore exists for a module, system and method for testing a PLL wherein the abovementioned disadvantages may be alleviated.

STATEMENT OF INVENTION

In accordance with a first aspect of the invention there is provided a module as claimed in claim 1.

In accordance with a second aspect of the invention there is provided a system as claimed in claim 2.

In accordance with a third aspect of the invention there is provided a module as claimed in claim 8.

Preferably the phase detection arrangement comprises a reference clock path having a first delay arrangement and a first latch arrangement coupled to receive a reference clock signal from the phase locked loop circuit, also a feedback clock path having second delay arrangement and second latch arrangement coupled to receive a feedback clock signal from the phase locked loop circuit, wherein the first latch arrangement is latched by the feedback clock signal and the second latch arrangement is latched by the reference clock signal.

The first and the second delay arrangements each preferably comprise a series of delay blocks, each delay block being formed by four inverters. Preferably the arrangement for performing calibration and jitter measurements includes a multiplexer arranged to receive the reference clock signal and a doubled reference clock signal from the phase locked loop circuit.

Preferably the arrangement for performing calibration and jitter measurements includes a series of delay blocks arranged as a ring circuit, each of the delay blocks providing a delayed output to a decoder. Each of the delay blocks is preferably formed by four inverters.

The analogue test arrangement preferably comprises: a test controller arranged to perform testing of the at least one analogue element; a first digital-to-analogue converter coupled to the test controller and arranged for providing a first analogue output; and a second digital-to-analogue converter coupled to the test controller and arranged for providing a second analogue output, wherein the first and second analogue outputs are used in combination to test the at least one analogue element. Preferably the first analogue output is substantially constant.

In this way a module, system and method for testing a phase locked loop are provided in which cycle-to-cycle and phase jitter measurements may be made. A calibration mechanism is provided allowing a process evaluation to be made and which allows the jitter data to be provided in a few seconds. The fully digital design facilitates easy manufacture and readily retargeting of the module to diverse applications and processes.

BRIEF DESCRIPTION OF THE DRAWINGS

One module for performing comprehensive testing and characterization of a PLL incorporating the present invention will now be described, by way of example only, with reference to the accompanying drawings, in which.

DESCRIPTION OF PREFERRED EMBODIMENT

Figure 1:
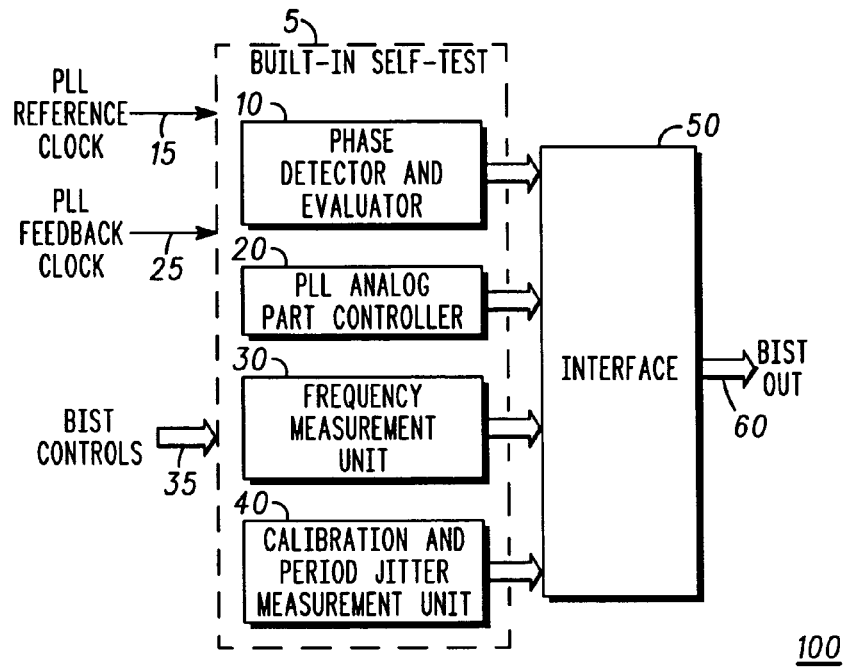
FIG. 1 shows a block-schematic diagram of a built-in self-test (BIST) module.

Referring to FIG. 1 of the drawings, there is shown a Built-In Self-Test (BIST) module 5 of a PLL circuit, which may be 'built-in' (i.e. embedded in) an integrated circuit having other modules or components. The module 5 is entirely fabricated as a digital design, and is 'self-test' because it includes embedded test units to be described below.

The module 5 comprises a phase detector/evaluator 10, a PLL analogue part control unit 20, an frequency measurement unit 30 and a calibration and period jitter measurement unit 40. The BIST 5 is arranged to receive a PLL reference clock signal 15, a PLL feedback clock signal 25 and a number of BIST control signals 35. Each element of the BIST 5 is coupled to an interface 50 from which output signals 60 are provided.

The DPLL BIST communicates with the DPLL module and includes the interface that should be defined by each project for dumping its data out. There are at least two interface possibilities: forwarding data to the IOs and storing it in an internal memory. In the first case the data will be processed by the tester and due to IO speed limitation only each "n" data will be stored. In the second case more data may be stored and an internal core will process it and generate the pass/fail signal indicating the test results.

Figure 2:
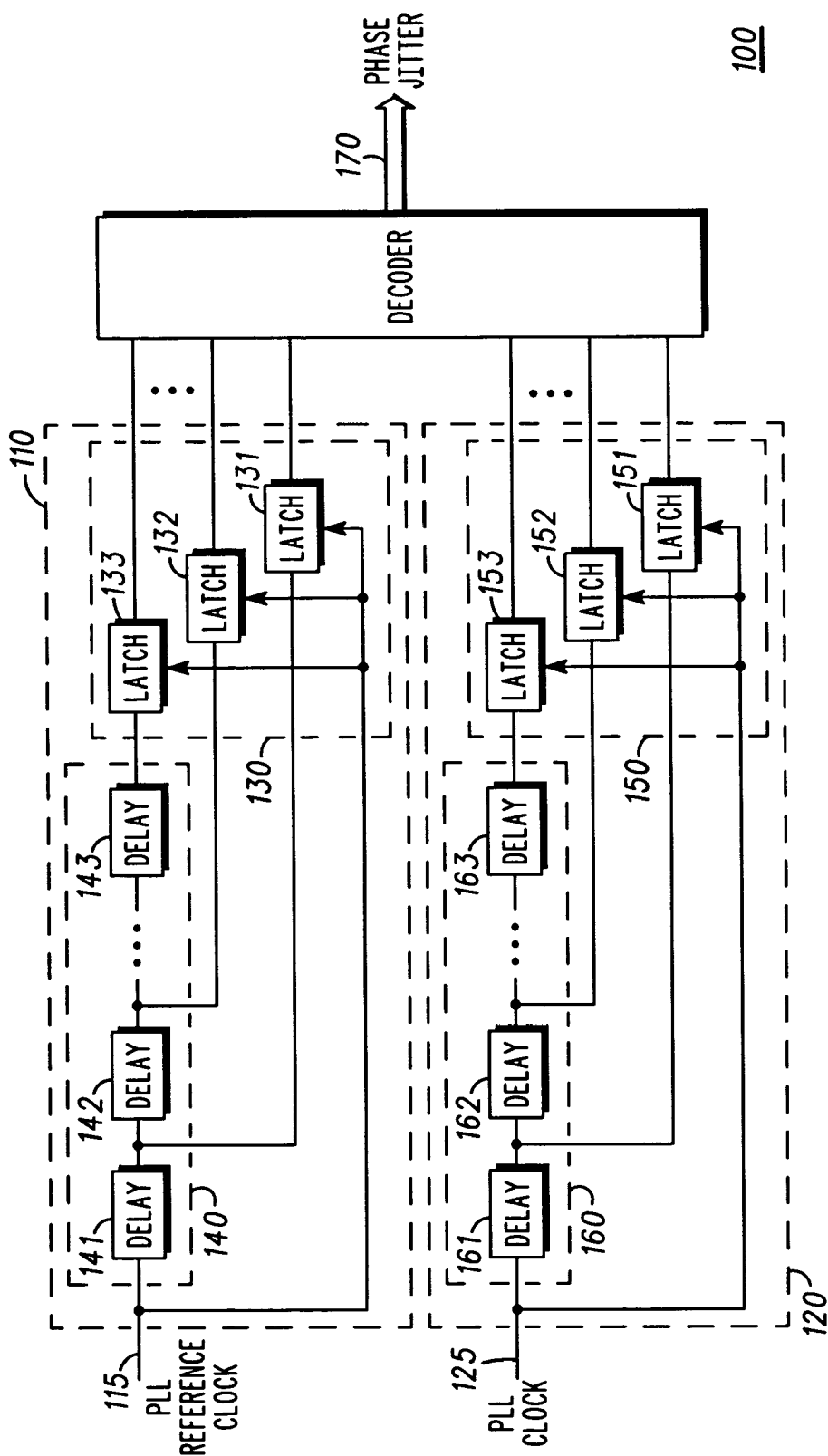
FIG. 2 shows a block-schematic diagram of the phase detector and evaluator unit of the BIST module of FIG. 1.

Referring now also to FIG. 2 there is shown the phase detector/evaluator unit 10 of FIG. 1 in greater detail, depicted as high-resolution phase detector/evaluator unit 100.

The phase detector/evaluator unit 100 of FIG. 2 includes a reference clock path 110 coupled to receive the PLL reference clock signal 115 (signal 15 of FIG. 1) and a feedback clock path 120 coupled to receive a PLL feedback clock signal 125 (signal 25) of FIG. 1.

The reference clock path 110 includes a series of latches 130 and a series of delay blocks 140. Each of the series of latches 130 is latched by the PLL feedback clock signal 125.

A first latch 131 of the series of latches 130 is coupled via a first delay block 141 of the series of delay blocks 140 to the PLL reference clock signal 115. A second latch 132 is coupled via the first delay block 141 and a second delay block 142 (in series with the first delay block 141) to the PLL reference clock signal 115. Similarly a third latch 133 is coupled via the first delay block 141, the second delay block 142 and a third delay block 143 (all in series) to the PLL reference clock signal 115.

The feedback clock path 120 includes a series of latches 150 and a series of delay blocks 160. Each of the series of latches 150 is latched by the PLL reference clock signal 115.

A first latch 151 of the series of latches 150 is coupled via a first delay block 161 of the series of delay blocks 160 to the PLL feedback clock signal 125. A second latch 152 is coupled via the first delay block 161 and a second delay block 162 (in series with the first delay block 161) to the PLL feedback clock signal 125. Similarly a third latch 153 is coupled via the first delay block 161, the second delay block 162 and a third delay block 163 (all in series) to the PLL feedback clock signal 125.

Each delay block of the series of delay blocks 140 and the series of delay blocks 160 has the resolution of a delay of 4 inverters from a standard cells library (about 200 ps at 0.18 μm process, although this is easily alterable).

Latched outputs from the series of latches 140 and series of latches 160 are fed to a decoder 170, which decodes the latched outputs to provide a phase jitter output signal to a 32-bit bus (not shown). The phase jitter output signal indicates the skew between the PLL reference clock and the PLL feedback clock. This information is provided in conjunction with the frequency of PLL reference clock and may be used outside the chip in a tester program or even accumulated and processed inside the chip if an Arithmetic Logic Unit (ALU) is provided on-board.

Figure 3:
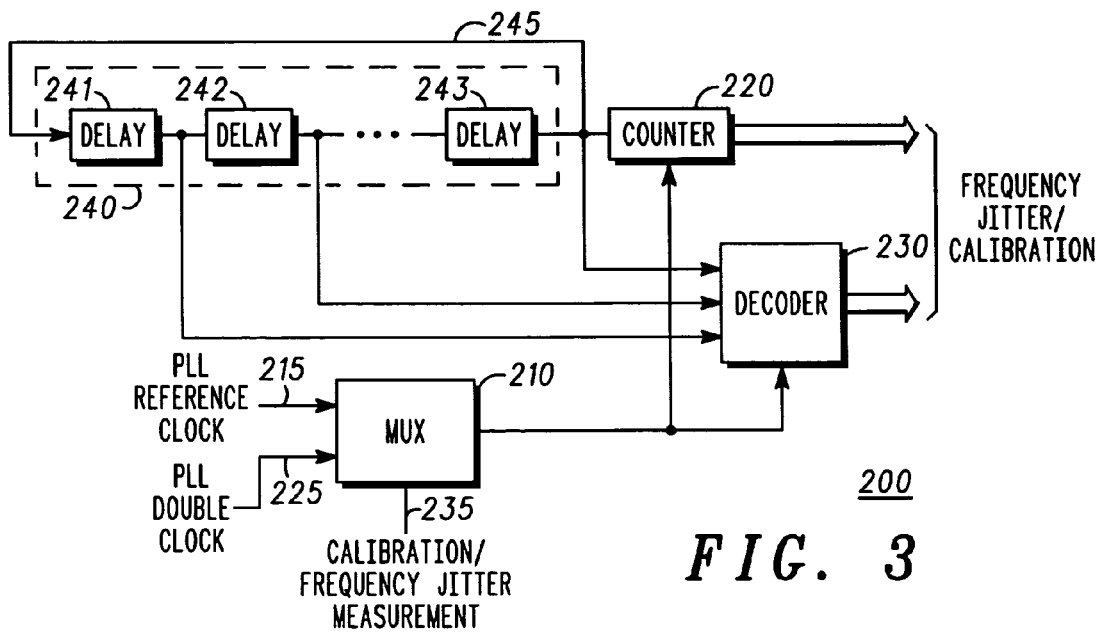
FIG. 3 shows a block-schematic diagram of the calibration and period jitter measurement unit of the BIST module of FIG. 1.

Referring now also to FIG. 3, there is shown the calibration and period jitter measurement unit 40 FIG. 1 in greater detail, depicted as high-resolution calibration and period jitter measurement Unit 200. Phase jitter is a magnitude of clock phase fluctuations relative to an ideal clock phase (the reference clock in the case of the BIST). Frequency jitter is defined as a magnitude of clock period fluctuations relative to an ideal clock period. Cycle to cycle jitter is the difference between two consecutive cycles of the clock signal.

The unit 200 of FIG. 3 includes a MUX block 210 coupled to receive the PLL reference clock signal 215 (signal 15 of FIG. 1) and a PLL double clock signal 225.

A first output of the MUX block 210 provides a calibration/frequency jitter measurement 235. A second output of the MUX block 210 is coupled to a counter 220 and a decoder 230 respectively.

The counter 220 is also coupled to receive a delay signal from a series of delay blocks 240 arranged in a ring configuration. A first delay block 241 of the series of delay blocks 240 is also coupled to receive this delay signal via a feedback loop 245 for providing a first delayed signal to the decoder 230. A second delay block 242 is also coupled to receive the first delayed signal from the first delay block 241 for providing a second delayed signal to the decoder 230. Similarly a third delay block 243 is also coupled to receive the second delayed signal from the second delay block 242 for providing a third delayed signal to the decoder 230.

The ring contains 15 delay blocks (of which three are shown) each of which is formed by inverters from a standard cells library. The counter 220 counts the number of complete ring cycles and the decoder 230 detects the sub ring cycle delay. The resolution is about 50 ps at 0.15 u process and the data is provided in conjunction with the frequency of the PLL feedback clock, and may be used outside the chip in the tester program or even accumulated and processed inside the chip if an ALU is present.

In this way the same hardware is used for calibration (the first part of test) and Cycle-to-Cycle Jitter measurement by multiplexing the PLL reference clock or PLL double clock at the block input.

Figure 4:
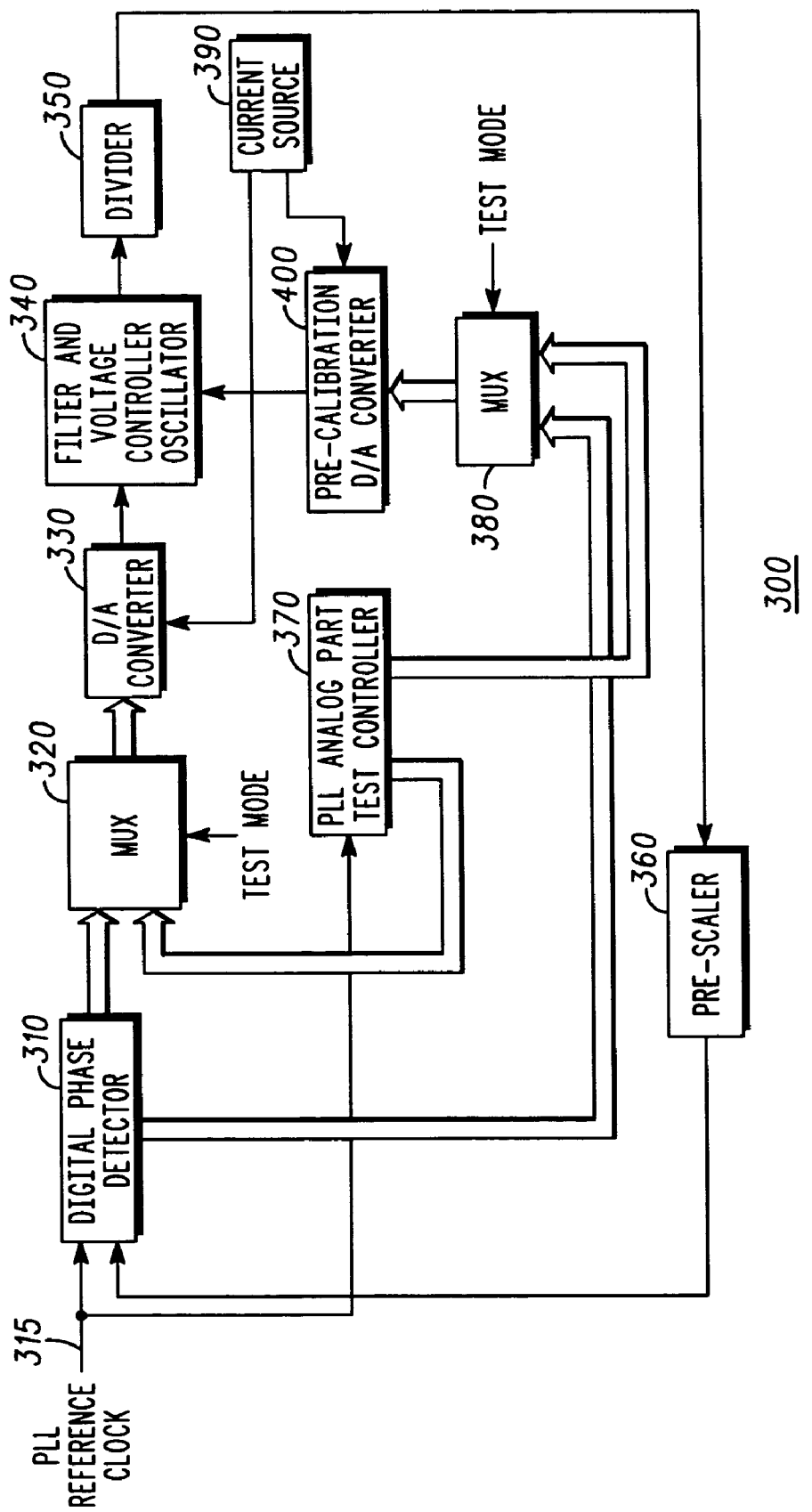
FIG. 4 shows a block-schematic diagram of the PLL analogue part test controller unit of the BIST module of FIG. 1.

Referring now also to FIG. 4 there is shown the PLL Analogue Part Control unit of FIG. 1 in greater detail, depicted as PLL Analogue Part Test Control unit 300.

The PLL analogue Part Test Control unit 300 includes a digital phase detector 310 coupled to receive a PLL reference clock signal 415 (signal 15 of FIG. 1) and a pre-scaler input signal to be further described below.

The digital phase detector 310 is coupled to provide phase detection signals to a first MUX block 320 and to a second MUX block 380.

A PLL analogue part test controller 370 is coupled to receive the PLL reference clock signal 415, and provides output signals to the first and second MUX blocks 320 and 280 respectively.

The first MUX block 320 provides a multiplex signal to a Digital-to-Analogue Converter (DAC) 330, where this signal is converted to an analogue signal. The analogue signal is filtered by a filter and Voltage Controlled Oscillator (VCO) circuit 340, and divided by a divider circuit 350 before being scaled by a pre-scaler circuit 360 where it becomes the pre-scaler input signal which is fed to the digital phase detector 310.

A current source 390 provides a current signal to a pre-calibration DAC 400 and to the DAC 330. The pre-calibration DAC 400 is also coupled to receive a multiplex signal from the second MUX block 380 and is arranged to provide an analogue signal to the filter and VCO circuit 340

The first MUX block 320, the test controller 370 and the second MUX block 380 are elements of the new BIST, whereas the DACs 330 and 400 are typically part of a standard PLL circuit, in test mode these DACs 330 and 400 are controlled by the BIST and in normal mode they are controlled by the PLL.

In operation, the pre-calibration DAC 400 output remains constant and the DAC 330 output increases in the first part of the test, and the range keeps constant and the sub-range increases in a cyclic manner in the second part of the test. The output frequency is measured using the frequency measurement unit 30 of FIG. 1 and a monotonic increase is expected from a PLL with no errors.

It will be understood that the module and system for comprehensive testing and characterization of a phase locked loop described above provide the following advantages:

The fully digital design facilitates easy manufacture and readily retargeting of the module to diverse applications and processes.

Cycle-to-cycle and phase jitter measurements may be made. A calibration mechanism is provided allowing a process evaluation to be made providing the possibility to get the jitter data in a few seconds.

It will be understood by a person skilled in the art that alternative embodiments to those described above are possible. For example, the precise number of delay blocks and latches may differ from that described above.

What is claimed is:

1. A digital test module for testing a phase locked loop circuit, the module comprising:
   phase detection means for performing phase measurements of the phase locked loop circuit;
   analogue test means for testing at least one analogue element of the phase locked loop circuit,
   wherein the analogue test means comprises:
      a test controller arranged to perform testing of the at least one analogue element;
      a first digital-to-analogue converter coupled to the test controller and arranged for providing a first analogue output; and
      a second digital-to-analogue convener coupled to the test controller and arranged for providing a second analogue output, wherein the first and second analogue outputs are used in combination to test the at least one analogue element;
   frequency measurement means for performing frequency measurements of the phase locked loop circuit; and
   means for performing calibration and jitter measurements.

2. The module of claim 1 wherein the first analogue output is substantially constant.

3. A digital test module for testing a phase locked loop circuit, the module comprising:
   phase detection means for performing phase measurements of the phase locked loop circuit,
   wherein the phase detection means comprises;
      a reference clock path having first delay means,
      a first latch means coupled to receive a reference clock signal from the phase locked loop circuit,
      a feedback clock path having second delay means, and
      a second latch means coupled to receive a feedback clock signal from the phase locked loop circuit, wherein the first latch means is latched by the feedback clock signal and the second latch means is latched by the reference clock signal;
   analogue test means for testing at least one analogue element of the phase locked loop circuit;
   frequency measurement means for performing frequency measurements of the phase locked loop circuit; and
   means for performing calibration and jitter measurements.

4. The module of claim 3 wherein the first and the second delay means each comprise a series of delay blocks, each delay block being fanned by four inverters.

5. The module according to claim 3 wherein the means for performing calibration and jitter measurements includes a multiplexer arranged to receive the reference clock signal and a doubled reference clock signal from the phase locked loop circuit.

6. The module of claim 5 wherein the means for performing calibration and jitter measurements includes a series of delay blocks arranged as a ring circuit, each of the delay blocks providing a delayed output to a decoder.

7. The module of claim 6 wherein each of the delay blocks is formed by four inverters.

8. A system comprising the module of claim 1 and the phase locked loop circuit integrated in a single device.

* * * * *